US006356163B1

(12) United States Patent
Dunsmore et al.

(10) Patent No.: US 6,356,163 B1
(45) Date of Patent: Mar. 12, 2002

(54) TUNING METHOD FOR FILTERS HAVING MULTIPLE COUPLED RESONATORS

(75) Inventors: Joel P Dunsmore, Sebastopol; Thomas B. Fetter, Santa Rosa, both of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/236,623

(22) Filed: Jan. 29, 1999

(51) Int. Cl.⁷ .................................................. H03H 7/12
(52) U.S. Cl. ........................ 333/17.1; 333/202; 333/235
(58) Field of Search ................................ 333/205, 209, 333/231, 232, 233, 234, 235, 17.1

(56) References Cited

U.S. PATENT DOCUMENTS

| | | | | | |
|---|---|---|---|---|---|
| 4,272,743 A | * | 6/1981 | Evans | ........................ | 333/176 |
| 6,014,554 A | * | 1/2000 | Smith | ......................... | 455/340 |
| 6,097,263 A | * | 8/2000 | Mueller et al. | ............. | 333/17.1 |
| 6,147,577 A | * | 11/2000 | Cavey | ........................ | 333/209 |

OTHER PUBLICATIONS

Milton Dishal, "Alignment and Adjustment of Synchronously Tuned Multiple Resonant Circuit Filters", Proceedings of the I.R.E., vol. 30, pp. 1448–1455, Nov. 1951.

* cited by examiner

Primary Examiner—Robert Pascal
Assistant Examiner—Stephen E. Jones
(74) Attorney, Agent, or Firm—John L. Imperato (57) ABSTRACT

A tuning method for filters having multiple coupled resonators isolates the characteristics of each resonator, enabling a specified filter response to be achieved by adjusting the resonators according to response criteria. A target frequency response is defined for the filter and a target time domain response is computed based on the target frequency response. From the time domain response, a gating function is generated for each of the resonators. A stimulus signal is provided to the filter and the response to the stimulus signal is measured. The gating functions are then applied to isolate the characteristics of each resonator. Each resonator is adjusted according to response criteria chosen to achieve a specified filter response when the response criteria are satisfied.

13 Claims, 9 Drawing Sheets

TUNING METHOD FOR FILTERS HAVING MULTIPLE COUPLED RESONATORS

BACKGROUND OF THE INVENTION

Filters that have multiple coupled resonators are well suited for use in communication systems. While the filters have low insertion loss, high stop-band isolation and other desirable performance characteristics, the filters are extremely sensitive to mis-tuning of the coupled resonators. Typically, the resonators within the filter require adjustment to achieve a specified filter response. Mechanically tuned waveguide filters, for example, include adjustment screws for tuning multiple resonant cavities within the filter.

Known filter tuning methods involve adjusting or tuning the resonant frequency of each resonator until the specified filter response is achieved. The adjustments are made as the overall filter response is observed on a display. However, due to coupling between resonators, the effect of tuning one resonator on the overall filter response is not isolated from the effect of tuning other resonators within the filter. This causes interactions between the resonators that influence the overall filter response in an unpredictable fashion, making it difficult to tune the filters to achieve the specified filter response.

SUMMARY OF THE INVENTION

According to the preferred embodiment of the present invention a tuning method isolates the characteristics of each coupled resonator of a filter, enabling a specified filter response to be easily achieved by adjusting the coupled resonators according to response criteria. A target frequency response is defined for a filter having multiple coupled resonators. A time domain response is derived from the target frequency response. From the time domain response, a gating function is generated for each of the resonators. A stimulus signal is provided to the filter and the response to the stimulus signal is measured. The gating functions are then applied to isolate the response characteristics of each of the coupled resonators enabling each resonator to be adjusted according to response criteria chosen to achieve a specified filter response when the response criteria are satisfied.

BRIEF DESCRIPTION OF THE DRAWINGS

FIG. 3b shows gating functions and a target time domain response corresponding to the target frequency response of FIG. 3a;

DETAILED DESCRIPTION OF THE PREFERRED EMBODIMENT

Figure 1:
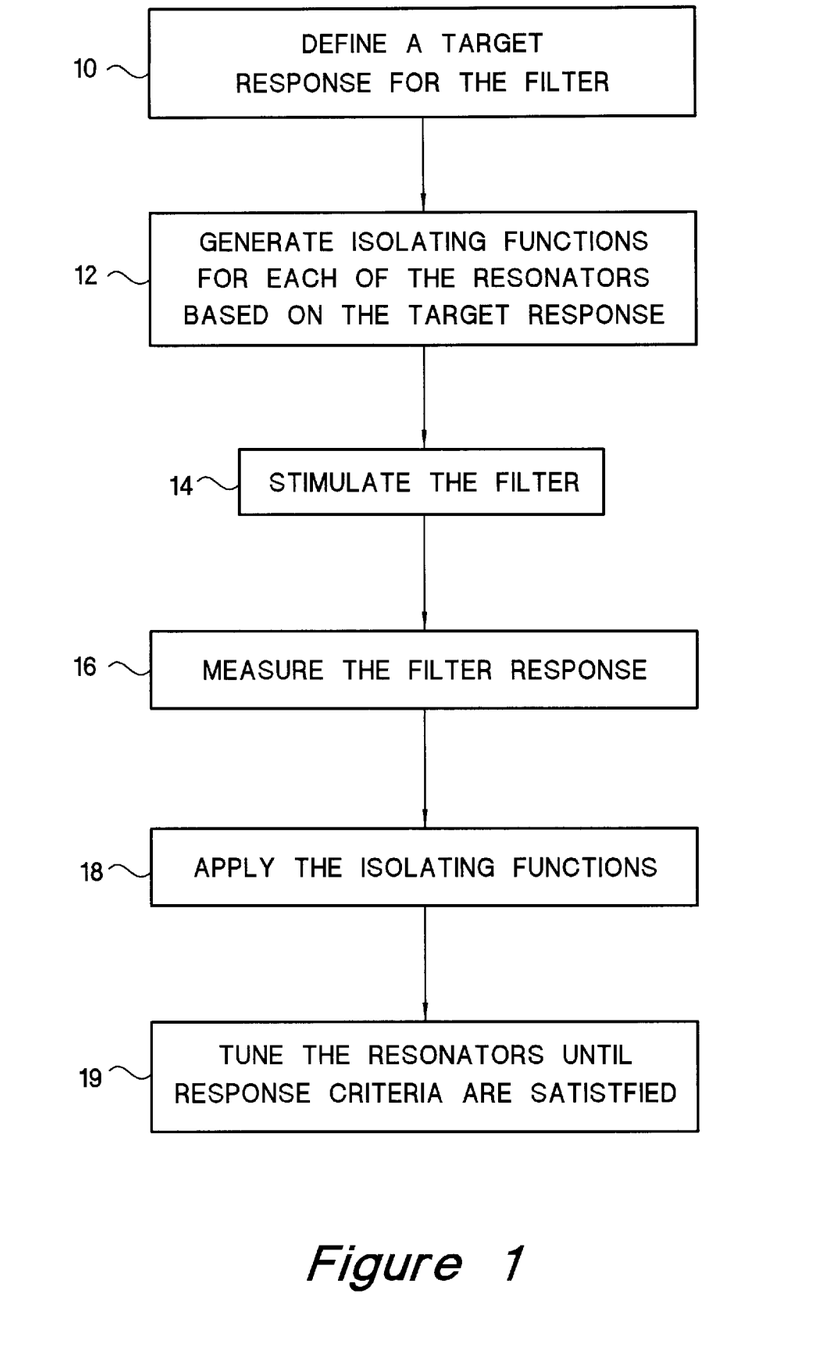
FIG. 1 shows a flow diagram of the tuning method constructed according to the preferred embodiment of the present invention for a filter having multiple coupled resonators.

FIG. 1 shows a flow diagram of a tuning method constructed according to the preferred embodiment of the present invention applied to a filter having multiple coupled resonators. In step 10 of the method, target parameters for the filter are defined. The defined target parameters are used in step 12 for generating isolating functions for each of the resonators within the filter. In steps 14–16, a stimulus signal is provided to the filter and a response to the stimulus signal is measured. In step 18, each of the isolating functions is applied to the measured response, enabling the characteristics of the individual resonators within the filter to be independently observed. In step 19, the resonators are tuned to satisfy response criteria chosen to achieve a specified filter response.

Figure 2:
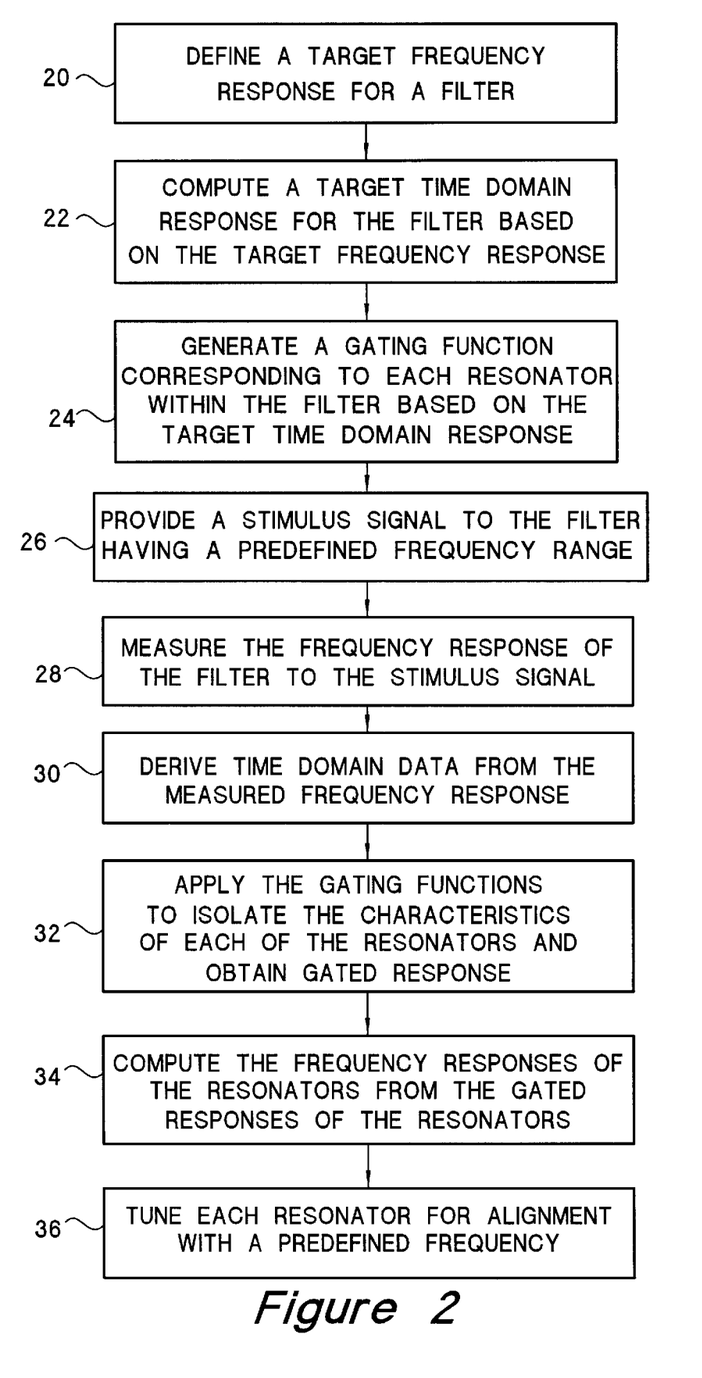
FIG. 2 shows a detailed implementation of the flow diagram of FIG. 1.
Figure 3A:
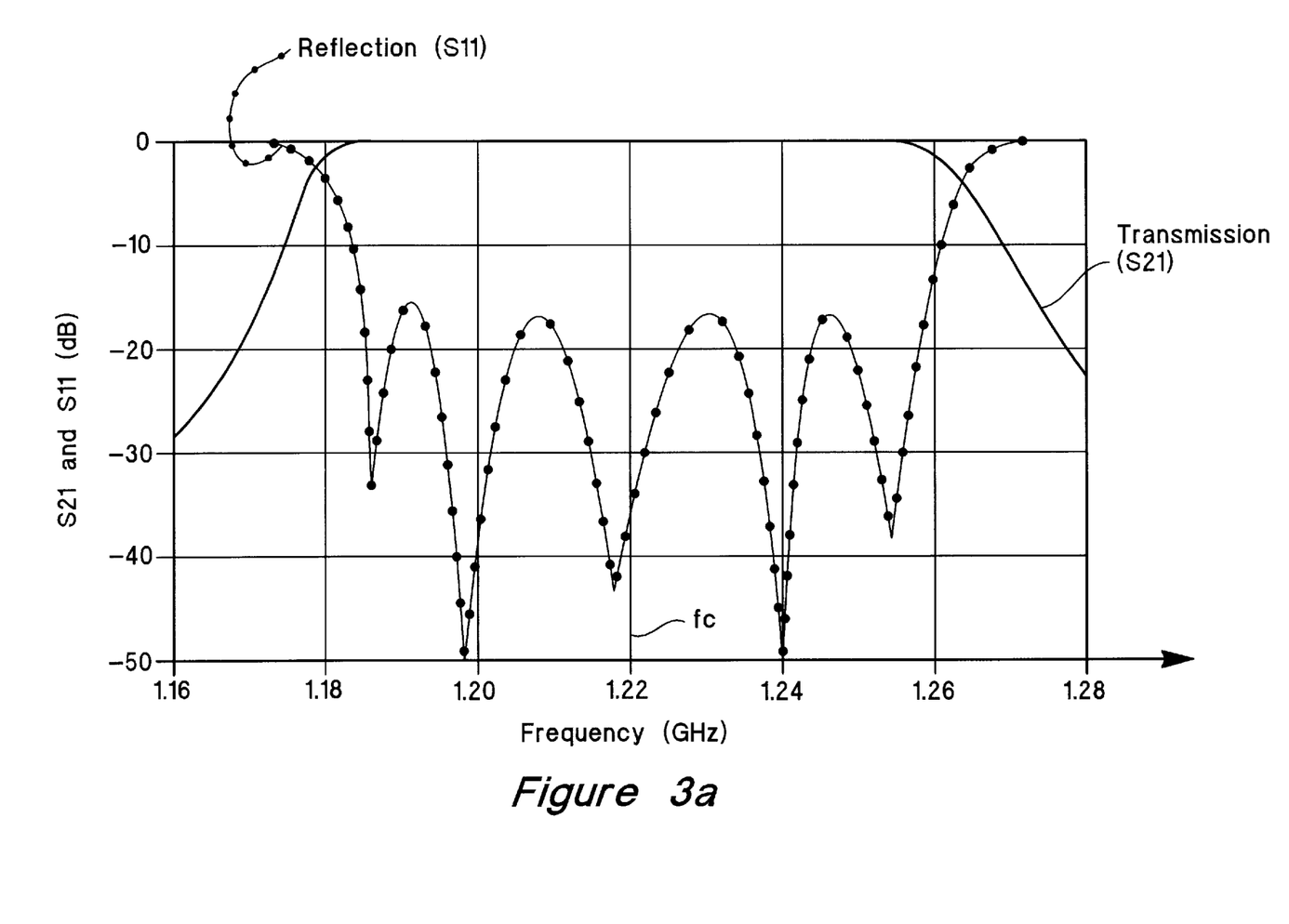
FIG. 3a shows a target frequency response for the filter for adjustment according to the detailed implementation of FIG. 2.
Figure 3B:
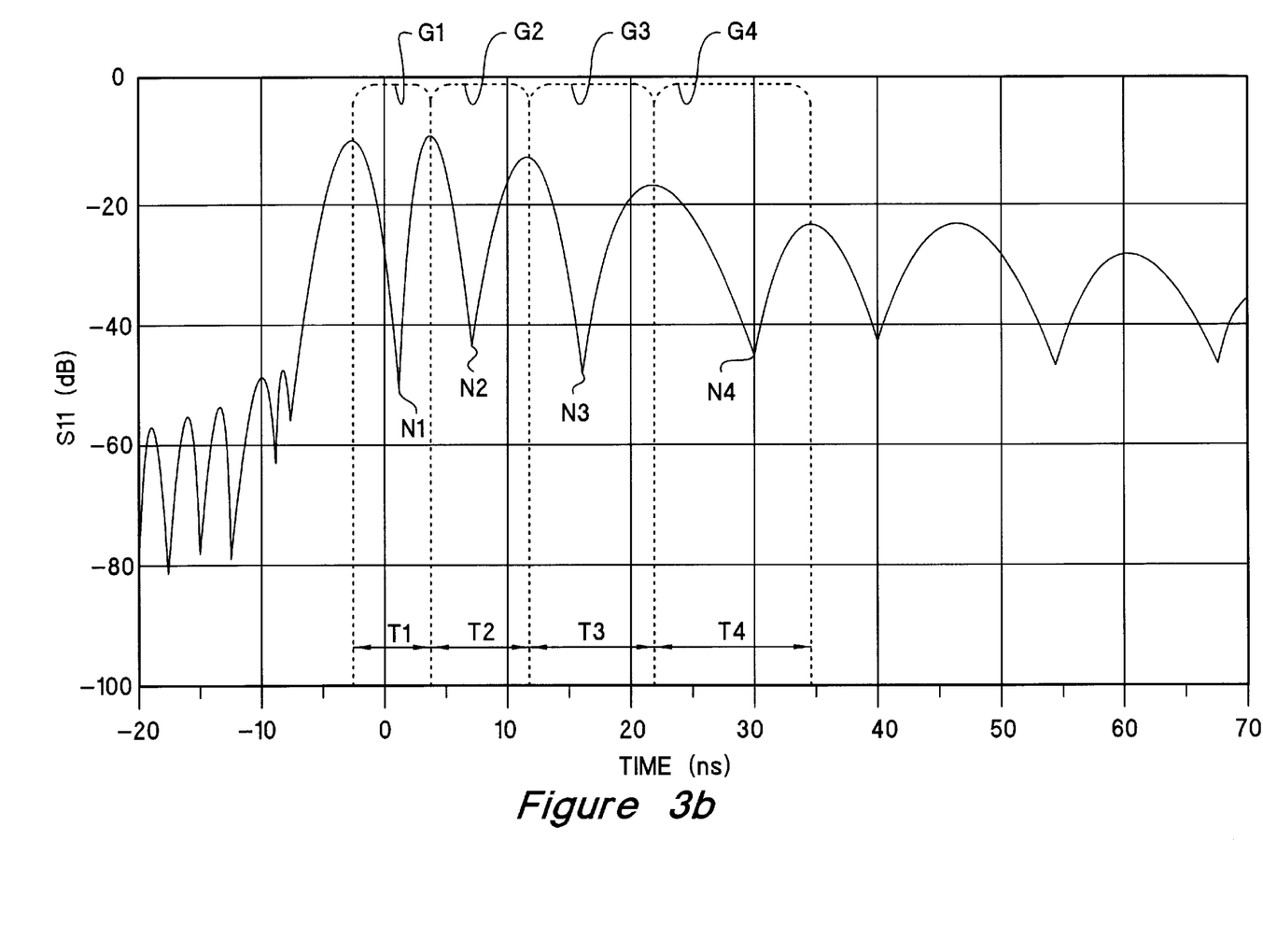

FIG. 2 shows a detailed implementation of the tuning method of FIG. 1. A filter having four coupled resonators is used to illustrate the tuning method. Steps 20–22 correspond to step 10 of FIG. 1 while steps 24, 26, 28, 36 correspond to steps 12, 14, 16, 19 of FIG. 1, respectively. Steps 30–34 correspond to step 18. In step 20 of FIG. 2, a target frequency response (shown in FIG. 3a) is generated for the filter. The target frequency response is generated using filter synthesis techniques, prestored filter characteristics, measured filter profiles or the response is generated based on the center frequency, bandwidth, ripple, cut-off frequency, stop-band rejection, or other designated filter parameters. In step 22, a target time domain response (shown in FIG. 3b) is derived based on the target frequency response. For example, the target time domain response is the inverse Fourier Transform of the target frequency response generated in step 20. Alternatively, the target time domain response is generated directly, in the absence of the target frequency response shown in step 20. For example, the target time domain response is mathematically synthesized for the filter having multiple coupled resonators, or the target time domain response is generated from measured or pre-defined time domain data or by other means sufficient for generating gating functions in step 24. As yet another alternative, the target time domain response is a designation of multiple time segments, each segment corresponding to a time interval T1, T2, T3 or T4 over which the response characteristic of a corresponding one of the multiple coupled resonators within the filter is dominant over the other resonators within the filter.

In step 24, gating functions for each resonator within the filter are generated. The gating functions are extracted from the target time domain response so that the contribution of each resonator to the overall response of the filter is isolated, enabling the contribution of each filter to be independently observed. In this example, the gating functions G1–G4 isolate time intervals T1–T4, respectively. The time intervals T1–T4 that are isolated, or windowed, by the gating functions G1–G4 include nulls N1–N4. In this example, each of the gating functions G1–G4 spans a time interval between consecutive peaks in the target time domain response.

Figure 3C:
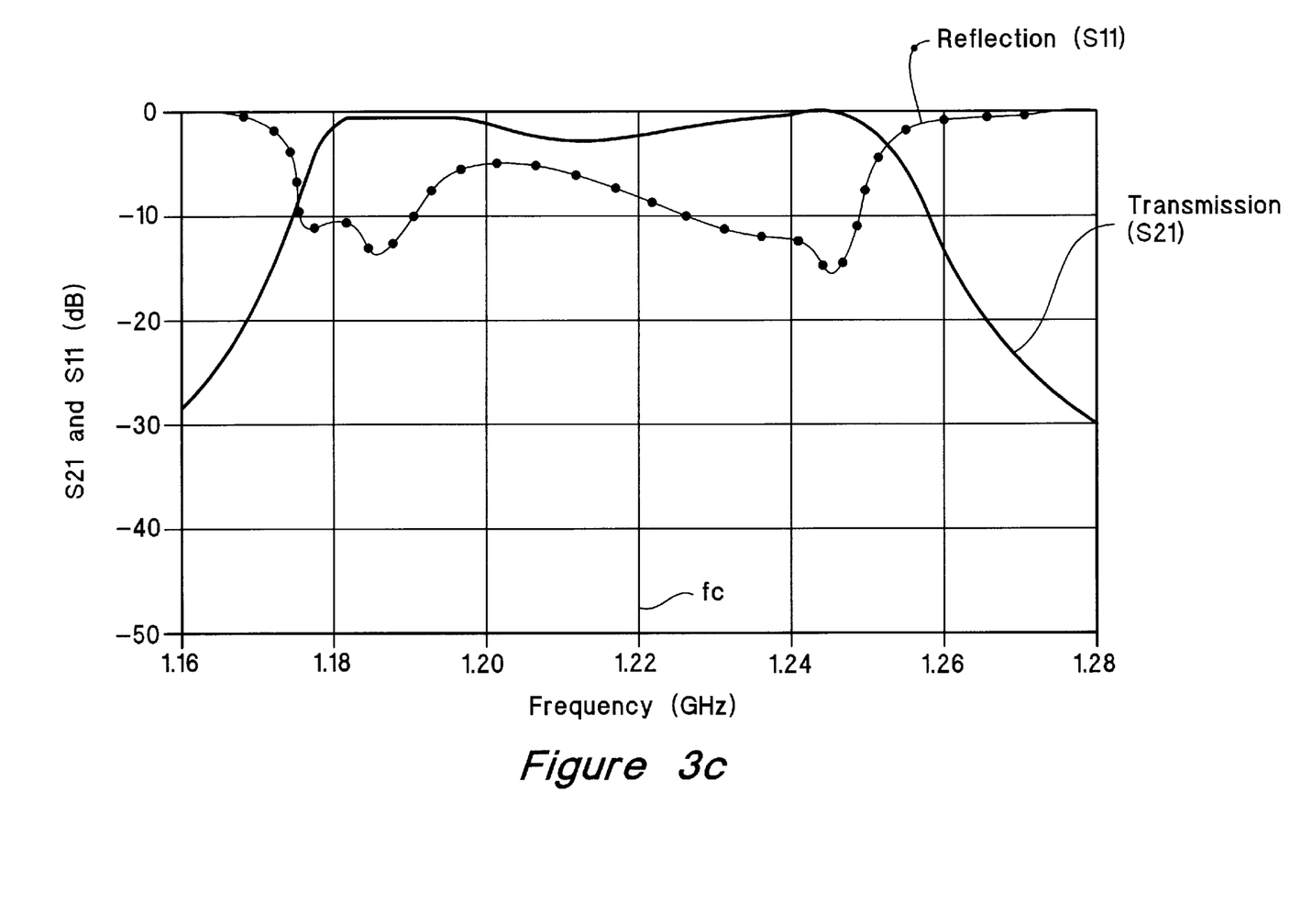
FIG. 3c shows frequency response data for the filter prior to tuning the resonators within the filter.
Figure 3D:
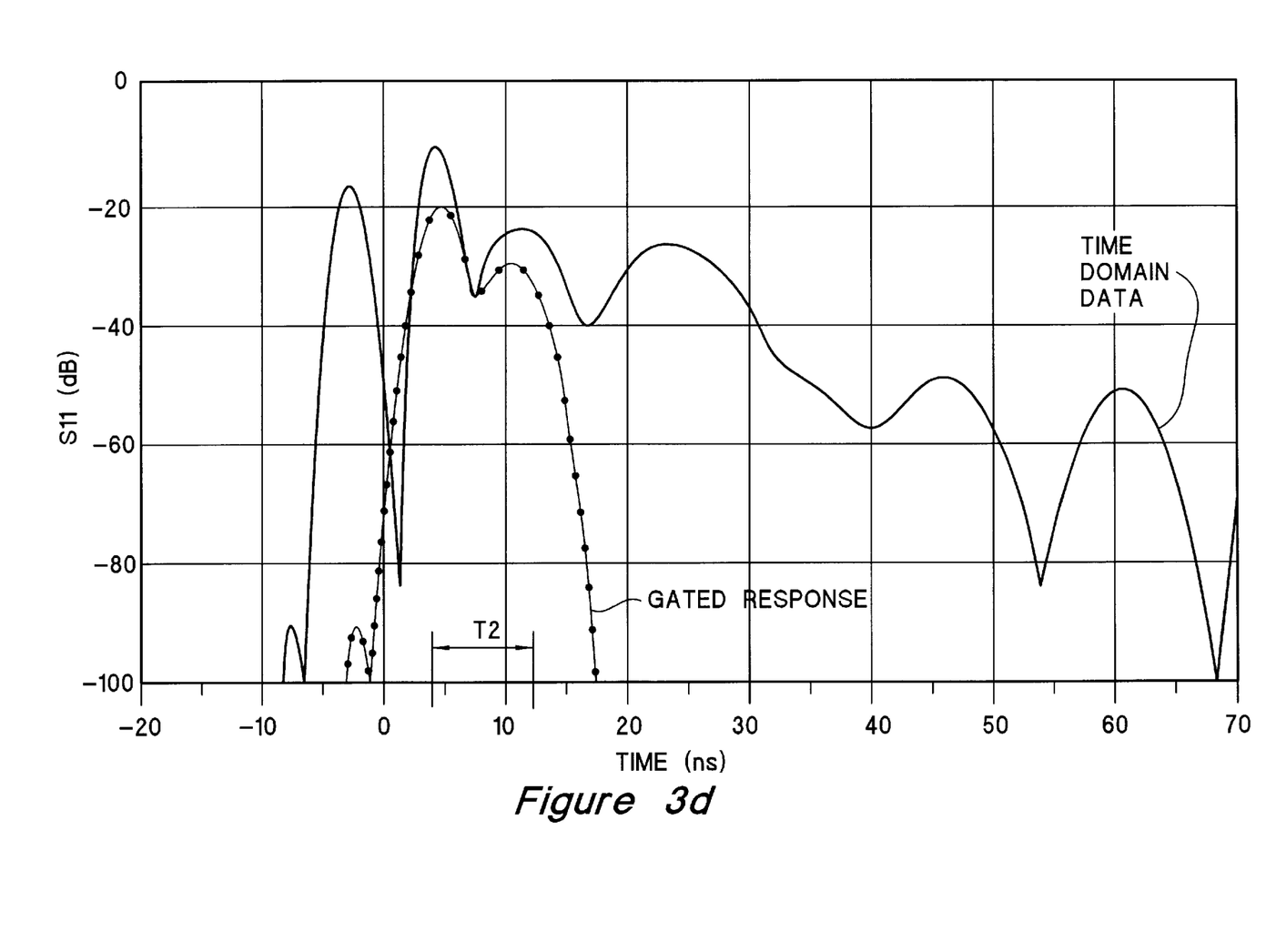
FIG. 3d shows time domain data corresponding to the frequency response data of FIG. 3c and time domain data with a gating function applied.

In step 26, a stimulus signal is applied to the filter. The stimulus signal includes a predefined frequency, such as the passband center frequency of the filter, and has a frequency span sufficiently broad to enable the time domain response of each resonator within the filter to be resolved and isolated. In step 28, the frequency response of the filter to the stimulus signal is measured to provide frequency response data (shown in FIG. 3c). In step 30, time domain data (shown in FIG. 3d) is derived from the measured frequency response data by taking the inverse Fourier Transform of the frequency response data. In step 32, the gating functions are each applied to the time domain data by multiplying the time domain data by each of the gating functions G1–G4 thereby isolating the characteristics of each of the resonators of the filter. When gating function G1 is applied to the time domain data, a first gated response results. The first gated response isolates the time interval T1 over which the characteristics of a first resonator within the filter are dominant over those of the other resonators. When gating function G2 is applied to the time domain data, a second gated response results. The second gated response isolates the time interval T2 over which the characteristics of a second resonator of the filter are dominant over those of the other resonators (shown in FIG. 3d). Similarly, as the other gating functions are applied to the time domain data, additional gated responses result, isolating the time intervals in which the characteristics of those resonators are dominant.

Figure 3E:
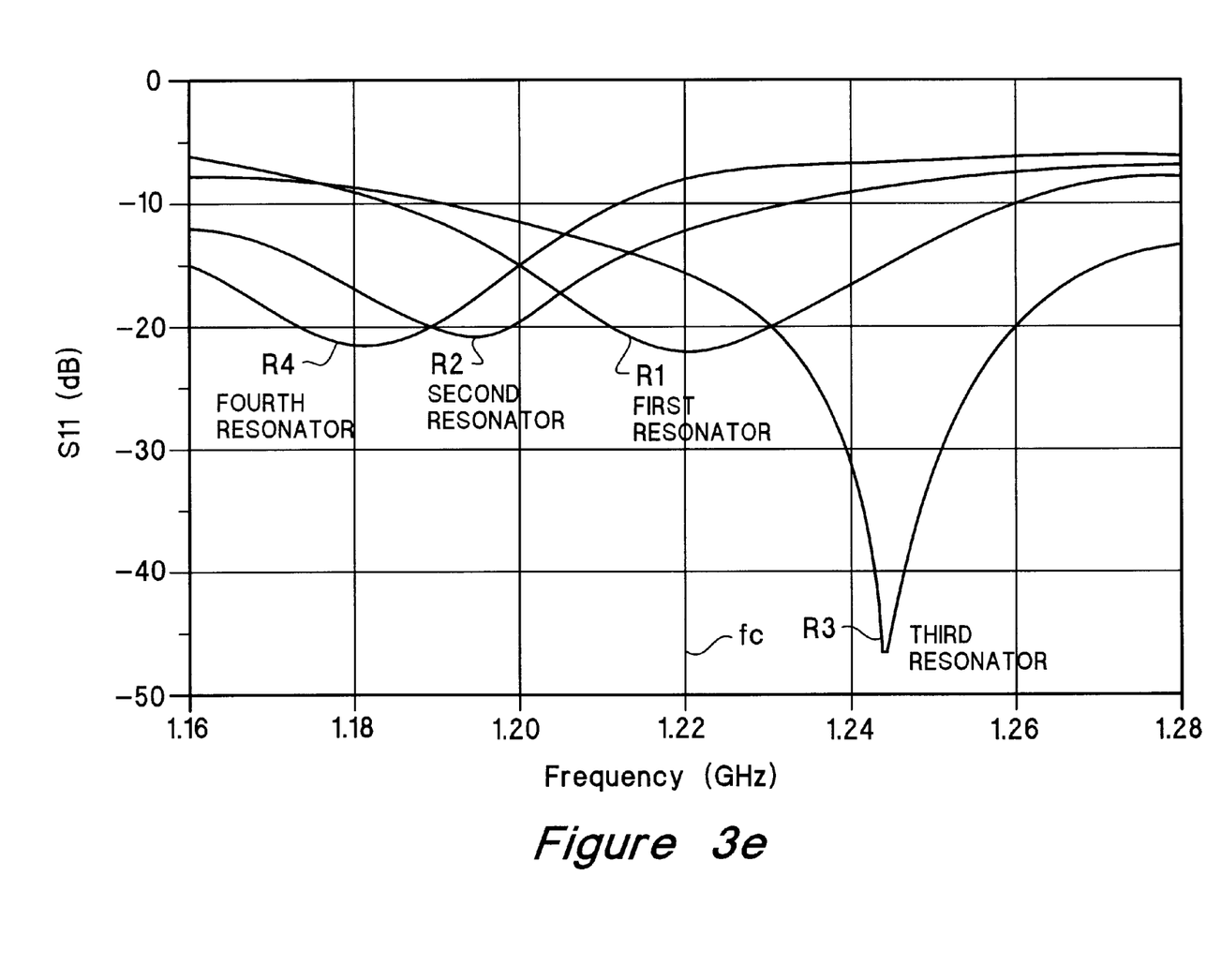
FIG. 3e shows gated frequency domain responses of resonators prior to tuning the resonators within the filter.

In step 34, gated frequency domain responses R1–R4 (shown in FIG. 3e) are computed by taking the Fourier Transform of each of the gated responses for each of the resonators.

Figure 3F:
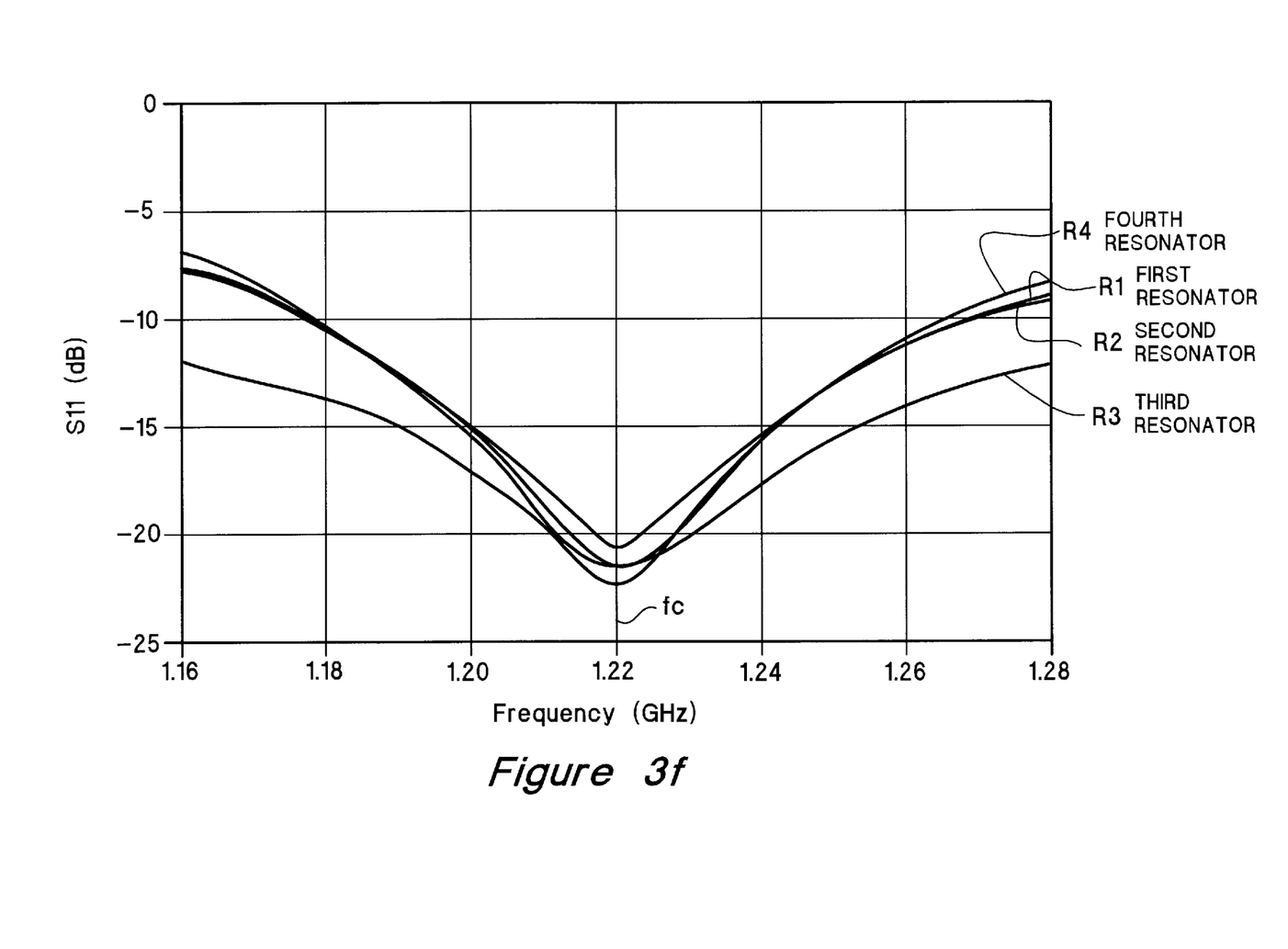
FIG. 3f shows gated frequency domain responses of the resonators as tuned to satisfy response criteria.
Figure 3G:
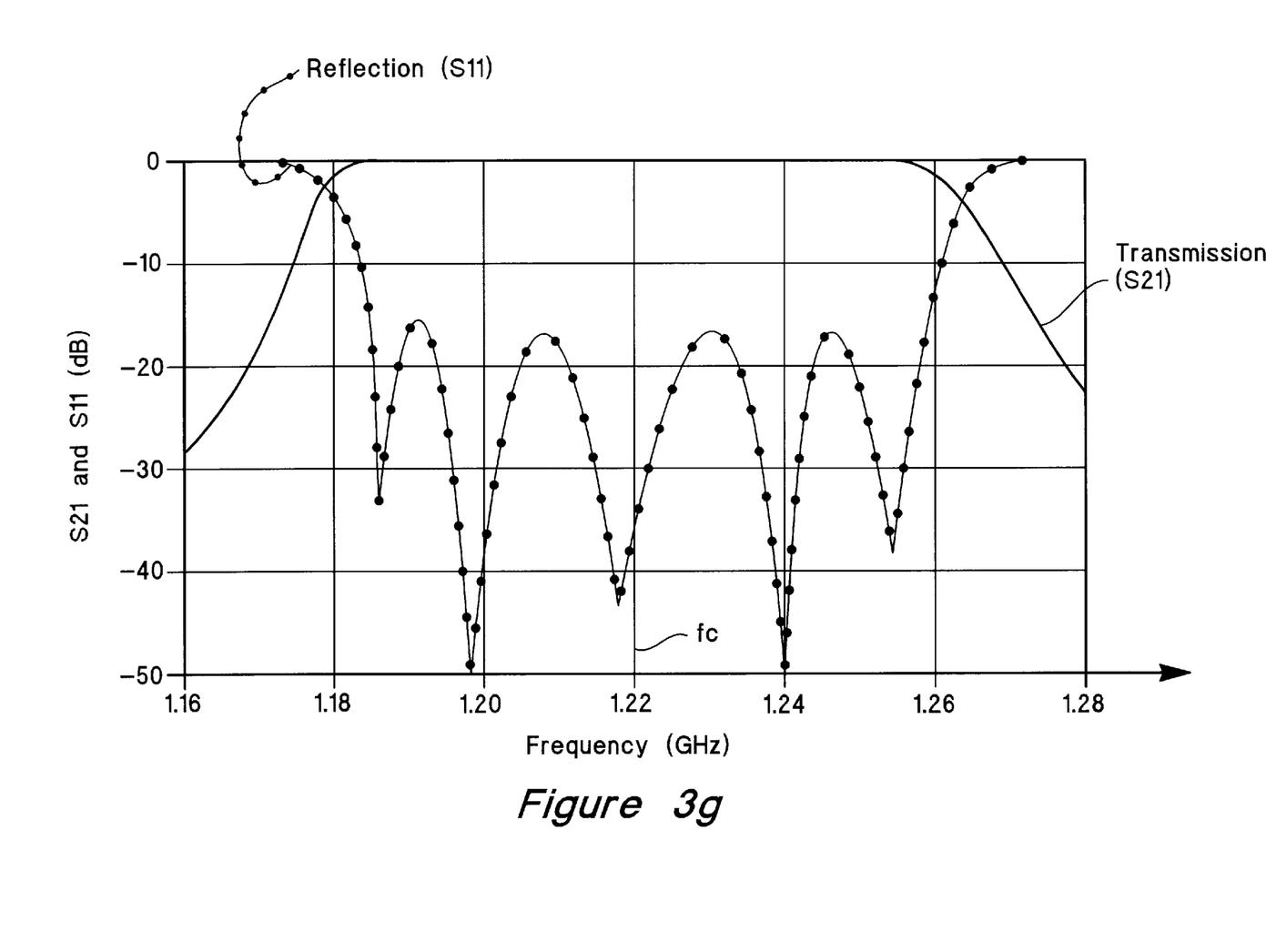
FIG. 3g shows the overall frequency response for the filter when the response criteria are satisfied.

In step 36, each of the resonators is adjusted to meet response criteria, such as alignment of the resonant frequency of the gated frequency domain responses R1–R4 with a center frequency fc of the filter (shown in FIG. 3f), defined so that a specified response (shown in FIG. 3g) is achieved for the filter when the response criteria are satisfied. The adjustment includes repetitions of steps 26–34 as the frequency domain responses R1–R4 of the resonators are observed, either independently or collectively, on a display or other output device.

Step 30 includes an inverse Fourier transform of the frequency response data into time domain data. Step 32 includes multiplying the time domain data by the corresponding gating functions G1–G4 and step 34 includes a Fourier transform of the gated responses into the frequency domain to obtain the frequency domain responses R1–R4. However, due to the inherent Fourier Transform relationship between the time domain and the frequency domain, the frequency domain responses R1–R4 are equivalently obtained using steps alternative to steps 30–34. For example, if step 30 is eliminated and the Fourier transforms of the gating functions G1–G4 are computed, the frequency domain responses R1–R4 result from a convolution of the frequency response data with the Fourier transform of the gating functions G1–G4.

Reflection characteristics at a stimulus port, such as the input reflection coefficient (or scattering parameter S11) or the output reflection coefficient (or scattering parameter S22) of the filter have been used to illustrate the tuning method constructed according to the preferred embodiment of the present invention. Transmission characteristics such as scattering parameters S21 or S12, or other measures indicative of the filter characteristics can also be used.

While the preferred embodiment of the present invention has been illustrated in detail, it should be apparent that modifications and adaptations to this embodiment may occur to one skilled in the art without departing from the scope of the present invention as set forth in the following claims.

What is claimed is:

1. A method for tuning a filter having multiple coupled resonators to achieve a specified filter response, comprising the steps of:

defining target parameters for the filter;

generating an isolating function corresponding to each of the resonators within the filter based on the target parameters;

stimulating the filter with a predefined stimulus signal;

measuring the response of the filter to the stimulus signal;

applying each of the isolating functions to the measured response of the filter to isolate a response characteristic for each of the multiple coupled resonators; and adjusting each of the resonators according to predefined response criteria, wherein the specified filter response is achieved when the response criteria are satisfied.

2. The method of claim 1 wherein the step of defining target parameters includes defining a target frequency response for the filter and computing a target time domain response for the filter based on the target frequency response.

3. The method of claim 2 wherein the target time domain response is the inverse Fourier Transform of the target frequency response.

4. The method of claim 2 wherein the target frequency response is mathematically synthesized.

5. The method of claim 2 wherein the target frequency response is based on measured frequency response data.

6. The method of claim 2 wherein the response characteristics of the isolated resonators are displayed independently on an output device.

7. The method of claim 2 wherein the response characteristics of the isolated resonators are displayed collectively on an output device.

8. The method of claim 1 wherein the step of defining target parameters for the filter includes specifying multiple time segments, each segment corresponding to a time interval in which a response characteristic of a corresponding one of the multiple coupled resonators within the filter is dominant.

9. The method of claim 1 wherein the step of defining target parameters for the filter includes deriving a time domain response for the filter and the isolating function for each of the resonators within the filter gates a time interval including a corresponding null in the target time domain response.

10. The method of claim 9 wherein the isolating functions for each of the resonators within the filter gates a time interval spanning between consecutive peaks in the target time domain response.

11. The method of claim 1 wherein the stimulus signal includes a center frequency of the filter.

12. The method of claim 1 wherein the step of defining target parameters for the filter includes mathematically synthesizing a time domain response.

13. The method of claim 1 wherein the step of defining target parameters for the filter includes generating a time domain response from measured data.

* * * * *